United States Patent
Yang

(10) Patent No.: US 8,207,013 B2
(45) Date of Patent: Jun. 26, 2012

(54) METHOD OF FABRICATING SILICON NANOWIRE SOLAR CELL DEVICE HAVING UPGRADED METALLURGICAL GRADE SILICON SUBSTRATE

(75) Inventor: Tsun-Neng Yang, Taipei (TW)

(73) Assignee: Atomic Energy Council Institute of Nuclear Energy Research, Taoyuan (TW)

( * ) Notice: Subject to any disclaimer, the term of this patent is extended or adjusted under 35 U.S.C. 154(b) by 0 days.

(21) Appl. No.: 12/885,095

(22) Filed: Sep. 17, 2010

(65) Prior Publication Data
US 2012/0070938 A1 Mar. 22, 2012

(51) Int. Cl.
*H01L 31/18* (2006.01)
(52) U.S. Cl. .......... 438/98; 438/503; 438/584; 438/798; 257/E31.11; 257/E51.038; 257/E51.04; 977/743; 977/762; 977/813; 977/888
(58) Field of Classification Search .................. 438/503, 438/584, 798; 257/E51.038, E51.04; 977/743, 977/762, 813, 814, 843, 888
See application file for complete search history.

(56) References Cited

U.S. PATENT DOCUMENTS

| | | | |
|---|---|---|---|
| 7,858,427 B2* | 12/2010 | Rana | 438/64 |
| 2005/0266662 A1* | 12/2005 | Yi | 438/479 |
| 2008/0128771 A1* | 6/2008 | Yang et al. | 257/296 |
| 2008/0135089 A1* | 6/2008 | Tsakalakos et al. | 136/248 |
| 2008/0187685 A1* | 8/2008 | Yang et al. | 427/597 |
| 2009/0120493 A1* | 5/2009 | Sinha | 136/255 |
| 2011/0042642 A1* | 2/2011 | Alet et al. | 257/9 |

FOREIGN PATENT DOCUMENTS
WO WO 2009/122113 * 11/2009

OTHER PUBLICATIONS

Kayes et al. (Radial PN Junction Nanorod Solar Cells: 2005 IEEE Photovoltaic Specialists Conference; pp. 55-58.*

* cited by examiner

*Primary Examiner* — Hsien Ming Lee
*Assistant Examiner* — Walter H Swanson
(74) *Attorney, Agent, or Firm* — Jackson IPG PLLC; Demian K. Jackson

(57) ABSTRACT

A simplified method for fabricating a solar cell device is provided. The solar cell device has silicon nanowires (SiNW) grown on an upgraded metallurgical grade (UMG) silicon (Si) substrate. Processes of textured surface process and anti-reflection thin film process can be left out for further saving costs on equipment and manufacture investment. Thus, a low-cost Si-based solar cell device can be easily fabricated for wide application.

10 Claims, 8 Drawing Sheets

METHOD OF FABRICATING SILICON NANOWIRE SOLAR CELL DEVICE HAVING UPGRADED METALLURGICAL GRADE SILICON SUBSTRATE

TECHNICAL FIELD OF THE DISCLOSURE

The present disclosure relates to making a solar cell device; more particularly, relates to simplifying processes of fabricating a low-cost silicon (Si)-based solar cell device by using atmospheric pressure chemical vapor deposition (APCVD) to directly grow silicon nanowires (SiNW) on an upgraded metallurgical grade (UMG) Si substrate.

DESCRIPTION OF THE RELATED ARTS

A need for energy grows fast nowadays and storage of petrochemical material is thus reduced rapidly. Cost for energy becomes higher with crises of earth warming, climate change and environment pollution.

Solar energy is a green and ever-lasting energy. The solar energy shown on earth for a day may fulfill needs of all people. Therefore, low-cost solar energy for wide application is very important to us.

Until the end of 2009, the market of crystallized Si solar cell still occupies more than 80 percents (%) global market of solar cells; and, at least for the next decade, it may remains as the main stream. Therein, the thin-film solar cells occupies about 10~20% of the market, which are mainly solar cells of copper indium gallium siselenide (CIGS) and non-crystallized Si thin film. Hence, a key issue for popularizing use of solar energy is to find a method for making a Si-based solar cell with low cost.

Traditional crystallized Si solar cells on the market are made of crystallized Si plates through Siemens method. Yet, the method has a high technical threshold with high equipment and manufacture investment. During 2008 to 2009, the price of the Si material for Siemens method had been raised to 500 US dollars per kilograms (USD/kg). Although the price is dropped down to 50~60 USD/kg now, it is still as high as several times, even 10 times, to the price of traditional petrochemical material.

Besides, although thin-film solar cell is proclaimed to have acceptable reduced price, its initial investment on equipment is still high and its conversion rate is low and unstable. Hence, the prior arts do not fulfill all users' requests on actual use.

SUMMARY OF THE DISCLOSURE

The main purpose of the present disclosure relates to is to simplify processes of fabricating a low-cost Si-based solar cell device by using APCVD to directly grow SiNW on a UMG Si substrate.

To achieve the above purpose, the present disclosure is a method of fabricating a SiNW solar cell device having a UMG silicon substrate, comprising steps of: (a) obtaining a UMG Si substrate having a purity lower than 99.999% (5N) and a thickness not thicker than 200 micrometers ($\mu$m); (b) cleaning a surface of the UMG Si substrate to be put into an e-gun evaporation equipment for forming a nickel (Ni) metal thin film covered on the surface of the UMG Si substrate; (c) putting the UMG Si plate into a reaction chamber of an APCVD equipment to be heated up for forming a teardrop-shaped Ni—Si liquid phase alloy with the Ni metal thin film and the UMG Si substrate, where at least some drops of the Ni—Si liquid phase alloy are distributed on a surface of the UMG Si plate and having a nanometer scale; (d) obtaining disilane ($Si_2H_6$) for a SiNW process with hydrogen ($H_2$) as a carrier gas and providing a doping gas to form SiNWs on the surface of the UMG Si plate started from the drops of the Ni—Si liquid phase alloy; (e) providing another doping gas to form a thin film on an outside surface of each SiNW for forming a P-N junction; and (f) sequentially forming a transparent conductive electrode through a sputtering deposition process, and then processing a screen printing for forming a front contact of silver paste and a back contact of aluminum paste. Accordingly, a novel method of fabricating a SiNW solar cell device having a UMG silicon substrate is obtained.

BRIEF DESCRIPTIONS OF THE DRAWINGS

The present disclosure will be better understood from the following detailed description of the preferred embodiment according to the present disclosure, taken in conjunction with the accompanying drawings, in which FIG. 1 is a flow chart showing a process of a preferred embodiment according to the present disclosure.

DESCRIPTION OF THE PREFERRED EMBODIMENT

The following description of the preferred embodiment is provided to understand the features and the structures of the present disclosure.

Figure 1:
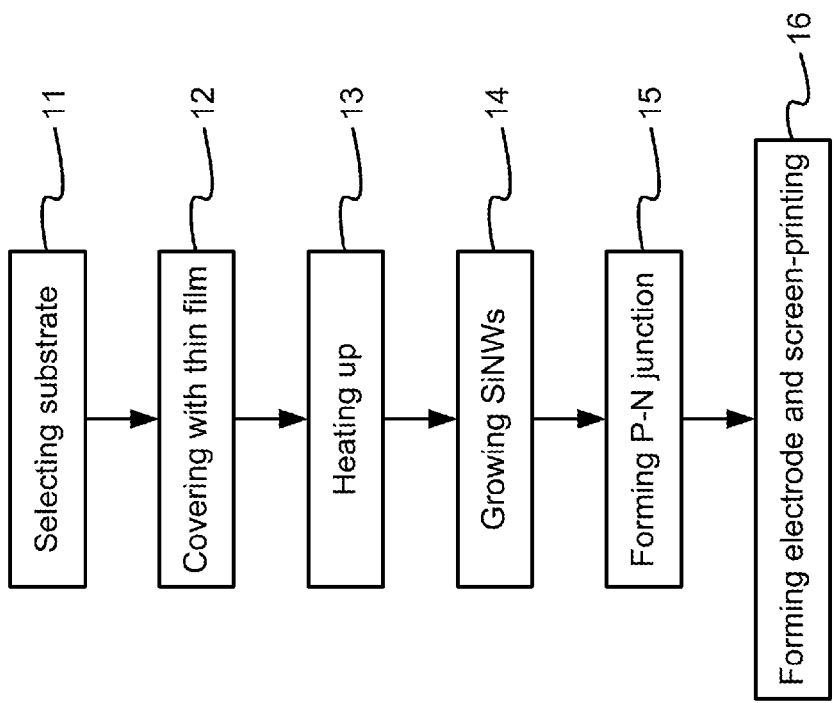
Figure 2:
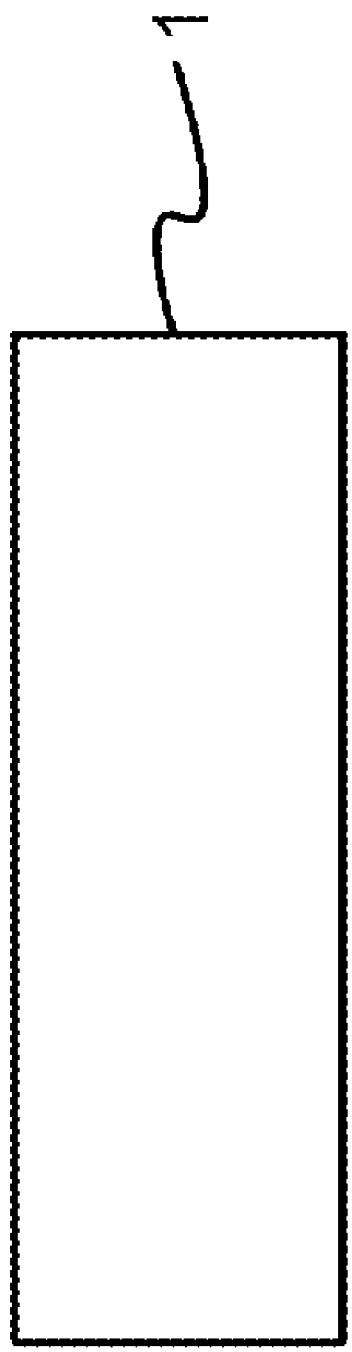
FIG. 2 is a view showing a substrate according to the present disclosure.

Please refer to FIG. 1 to FIG. 8, which are views showing a preferred embodiment according to the present disclosure; and views showing a substrate, a covered film, a heating-up process, SiNWs, a positive-negative (P-N) junction, a screen printing and front contacts. As shown in the figures, the present disclosure is a method of fabricating a silicon nanowire (SiNW) solar cell device having an upgraded metallurgical grade (UMG) silicon (Si) substrate, comprising the following steps:

(a) Selecting substrate 11: In FIG. 2, a positive type (p-type) UMG Si plate 1 is selected as a substrate, which has a purity lower than 99.999% (5N) and a thickness not thicker than 200 micrometers ($\mu$m) and can be a p-type or a negative type (n-type) UMG Si plate.

Figure 3:
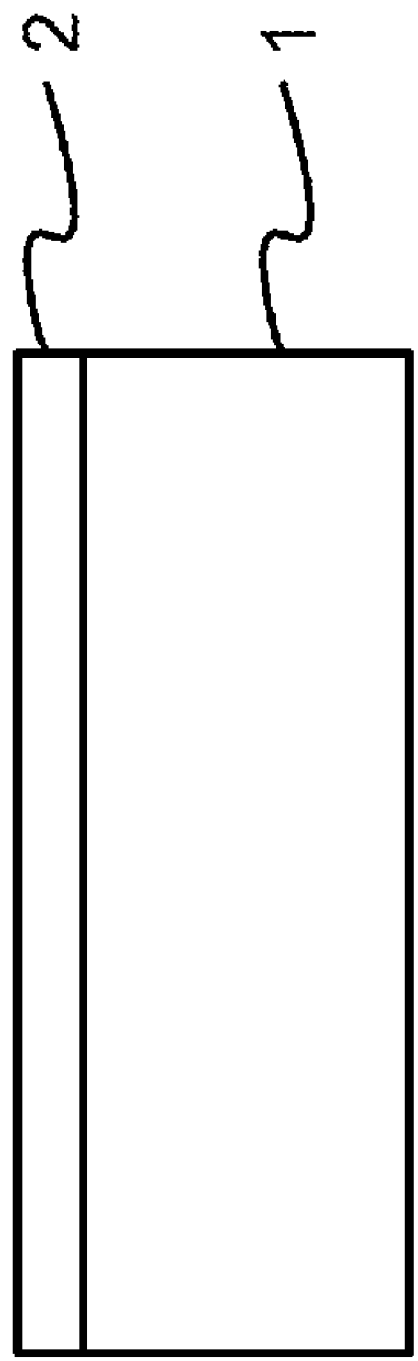
FIG. 3 is a view showing a covered film according to the present disclosure.

(b) Covering with thin film 12: In FIG. 3, after cleaning a surface of the UMG Si plate 1, the UMG Si plate 1 is put into an electron-gun (e-gun) evaporation equipment to cover a nickel (Ni) metal thin film 2 on the UMG Si plate 1, where the Ni metal thin film 2 has a thickness between 30 and 100 nanometers (nm) and is used as a catalyst for growing SiNW.

Figure 4:
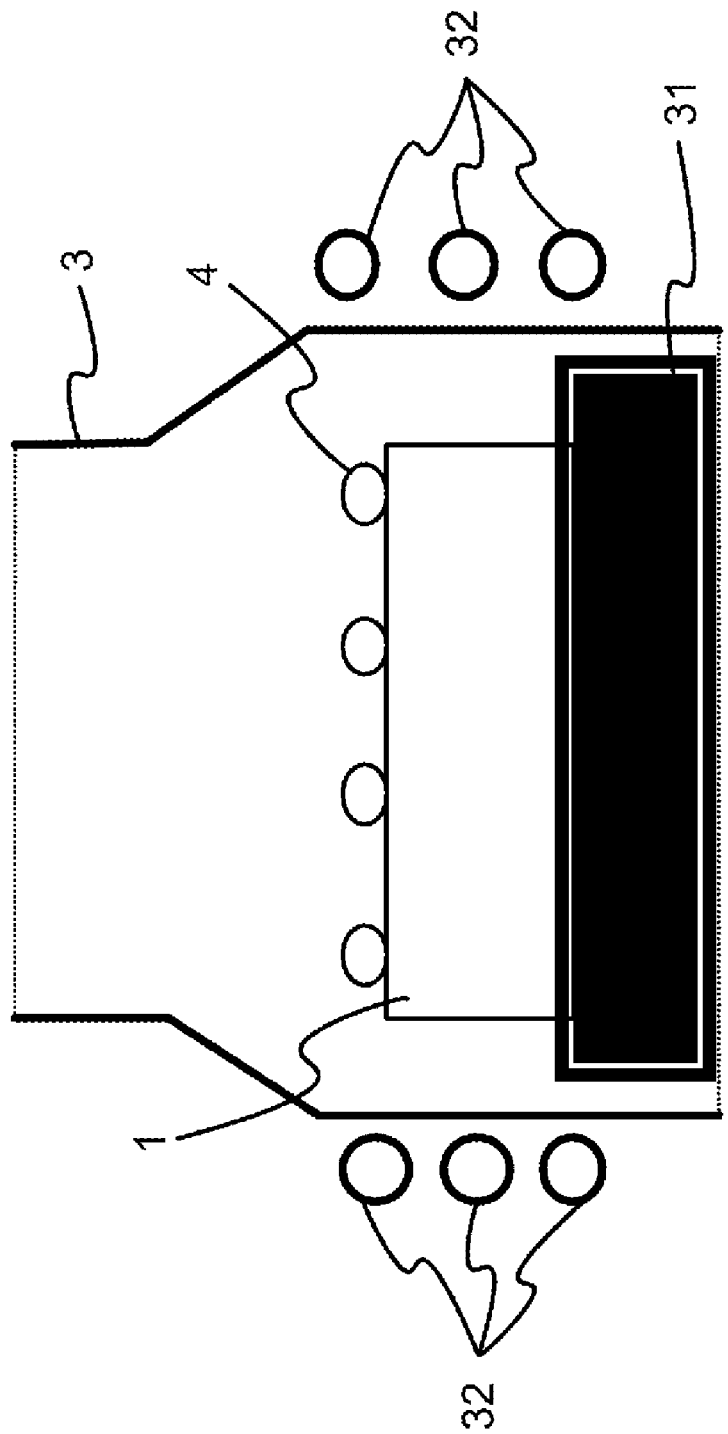
FIG. 4 is a view showing a heating-up process according to the present disclosure.

(c) Heating up 13: In FIG. 4, the UMG Si plate 1 covered with the Ni metal thin film 2 is put into a reaction chamber 3 of an atmospheric pressure chemical vapor deposition (APCVD) equipment on a graphite susceptor 31 to be heated up. Radiofrequency coils 32 twined outside around the reaction chamber 3 are used for heating up the graphite susceptor 31 in the reaction chamber 3 to form a teardrop-shaped Ni—Si liquid phase alloy 4 with the Ni metal thin film 2 and the UMG Si plate 1. Therein, at least some drops of the Ni—Si liquid phase alloy 4 are distributed on an upper surface of the UMG Si plate 1 with each of such drops having a nanometer scale.

Figure 5:
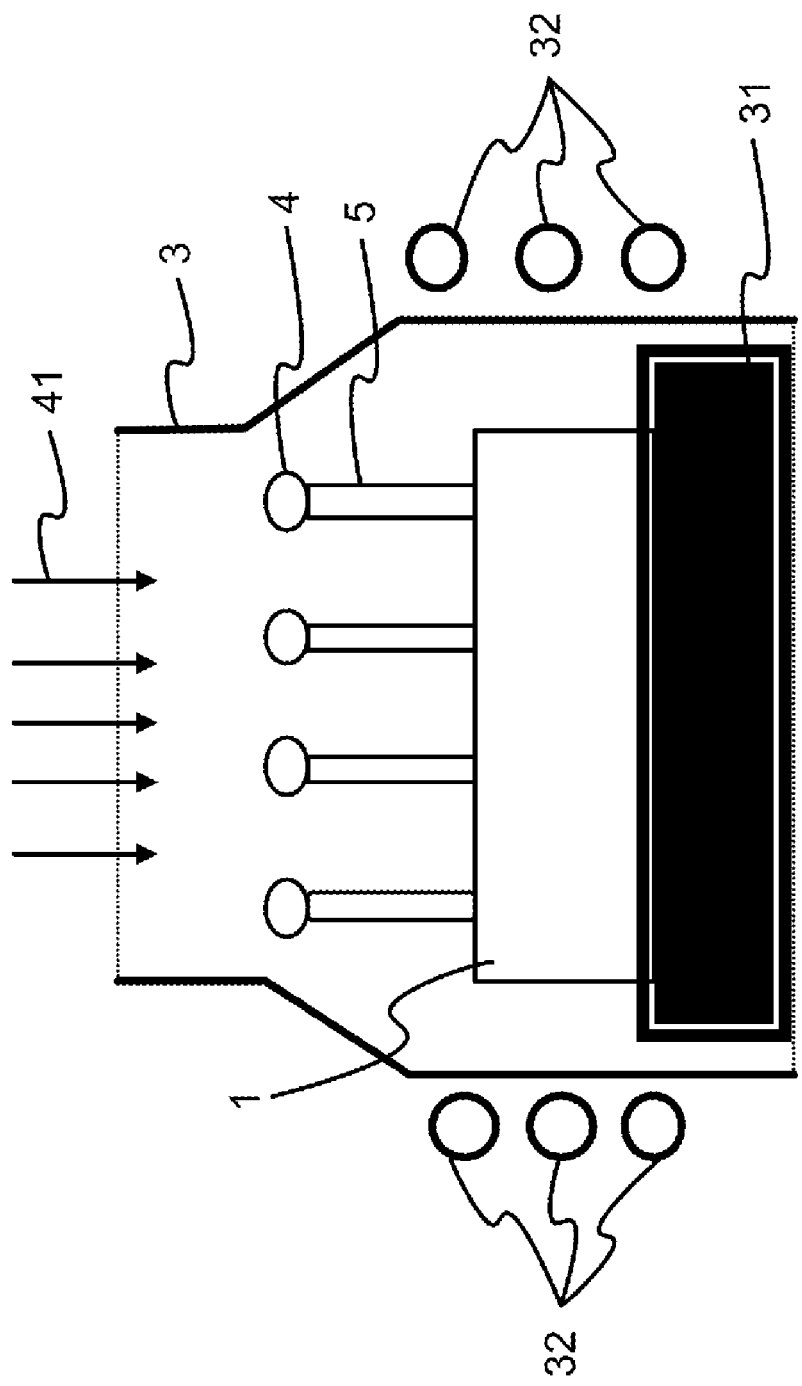
FIG. 5 is a view showing the SiNWs according to the present disclosure.

(d) Growing SiNWs 14: In FIG. 5, at a temperature between 650 and 700 Celsius degrees (° C.), feedstock gases 41 including disilane ($Si_2H_6$) is used for a SiNW process with hydrogen ($H_2$) used as a carrier gas; and diborane ($B_2H_6$) is provided as a doping gas. After a time period between 1 and 10 minutes (min), p-type SiNWs 5 are formed on the upper surface of the UMG Si plate 1 to be used as a solar light absorption layer, while each SiNW 5 has a length of at least 10 μm and is started from a drop of the teardrop-shaped Ni—Si liquid phase alloy 4. Therein, the SiNW 5 is grown by using a vapor-liquid-solid (VLS) mechanism revealed by Wagner and Ellis (Appl. phys. lett., 1964, 4, 89).

Figure 6:
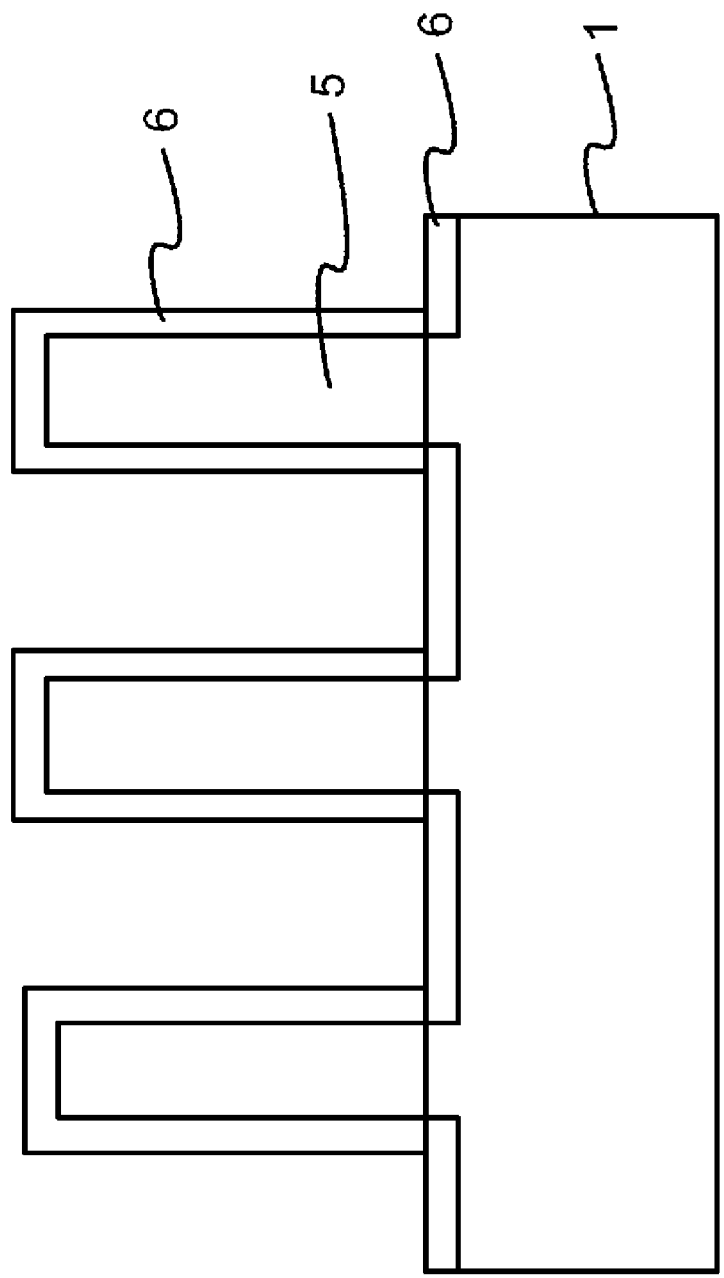
FIG. 6 is a view showing the P-N junction according to the present disclosure.
Figure 7:
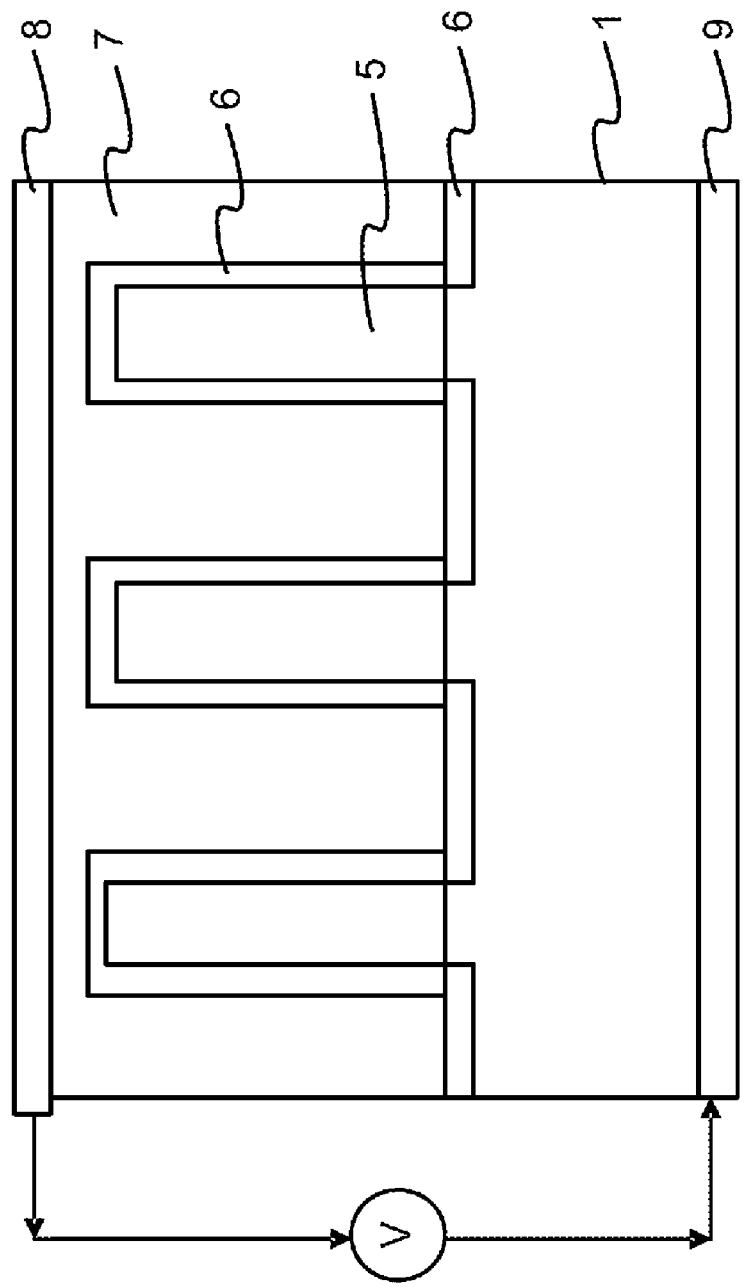
FIG. 7 is a view showing the screen printing according to the present disclosure.

(e) Forming a positive-negative (P-N) P-N junction 15: In FIG. 6, phosphine ($PH_3$) is provided as another doping gas to obtain an n-type thin film 6 on an outside surface of each of the SiNWs 5 for forming a P-N junction at diffusion at a temperature of about 800 Celsius degrees (° C.)±10° C.

(f) Forming electrode and screen-printing 16: Sequentially, for forming a front contact of metal 8, such as a front contact of silver paste (shown in FIG. 7) and a back contact of metal 9, such as a back contact of aluminum paste, a transparent conductive electrode 7 is formed through a sputtering deposition process and then a screen printing is processed. Thus, a SiNW solar cell device having a UMG Si substrate is fabricated.

Figure 8:
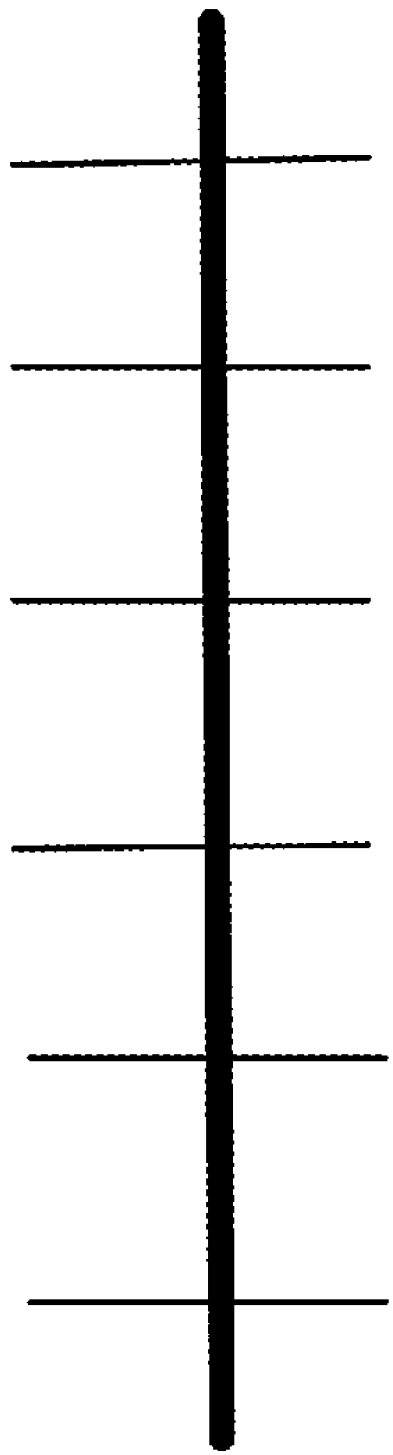
FIG. 8 is a view showing the front contacts according to the present disclosure.

FIG. 8 shows a view of front contacts.

If the UMG Si plate provided is n-type, the doping gas used in step (d) can be $PH_3$ for growing n-type SiNWs, and the doping gas used in step (e) can be $B_2H_6$ for forming an n-type thin film on an outside surface of each SiNW.

The present disclosure uses APCVD and screen printing with simplified processes and reduced cost. Only little Si material, used in SiNW, and a low cost UMG Si substrate are used for successfully growing SiNWs on the UMG Si substrate to obtain a SiNW solar cell device. On using the present disclosure, an APCVD equipment is used to grow n-type (or p-type) SiNWs for forming a p-n structure of a solar cell on a low-cost UMG Si substrate having a purity smaller then 5N with a Ni metal thin film used as a catalyst; and, at last, with materials of silver paste and aluminum paste, front and back contacts are formed through screen printing for obtaining a SiNW solar cell device having a UMG Si substrate.

Hence, the present disclosure has the following advantages:

1. APCVD is used to directly grow SiNWs without vacuum system.
2. Very little Si material is used to form solar light absorption layer, i.e. SiNWs.
3. A low-cost UMG Si material is used for a substrate with a cost one-tenth to that of a substrate made through Siemens method.
4. A simplified method for fabricating a solar cell device is provided, which is a SiNW solar cell device using a UMG Si substrate. Processes of textured surface process and anti-reflection thin film process are left out for further saving costs on equipment and manufacture.

To sum up, the present disclosure is a method of fabricating a SiNW solar cell device having a UMG Si substrate, where an APCVD equipment is used to grow n-type (or p-type) SiNWs for forming a p-n structure of a solar cell on a low-cost UMG Si substrate having a purity smaller then 5N with a Ni metal thin film used as a catalyst and, at last, with materials of silver paste and aluminum paste, front and back contacts are formed through screen printing for obtaining a SiNW solar cell device having a UMG Si substrate.

The preferred embodiments herein disclosed are not intended to unnecessarily limit the scope of the disclosure. Therefore, simple modifications or variations belonging to the equivalent of the scope of the claims and the instructions disclosed herein for a patent are all within the scope of the present disclosure.

What is claimed is:

1. A method of fabricating a silicon nanowire (SiNW) solar cell device having an upgraded metallurgical grade (UMG) silicon (Si) substrate, the method comprising:

obtaining a UMG Si plate as a substrate, the UMG Si plate having a purity lower than 99.999% (5N) and a thickness not thicker than 200 micrometers (μm);

cleaning a surface of the UMG Si plate;

placing the UMG Si plate into an electron-gun (e-gun) evaporation equipment to obtain a nickel (Ni) metal thin film covering the surface of the UMG Si plate;

heating up the UMG Si plate covered with said Ni metal thin film in a reaction chamber of an atmospheric pressure chemical vapor deposition (APCVD) equipment to obtain a nickel-silicon (Ni—Si) liquid phase alloy with said Ni metal thin film and said UMG Si plate, forming said Ni—Si liquid phase alloy having teardrop-shaped drops, at least some of said teardrop-shaped drops of said Ni—Si liquid phase alloy being distributed on the surface of the UMG Si plate and each of the teardrop-shaped drops of said Ni—Si liquid phase alloy having a nanometer scale;

obtaining disilane ($Si_2H_6$) for a SiNW process with hydrogen ($H_2$) as a carrier gas and providing a doping gas to obtain a plurality of SiNWs on the surface of the UMG Si plate that has the at least some teardrop-shaped drops of said Ni—Si liquid phase alloy, each of the SiNWs being started from a respective teardrop-shaped drop of the Ni—Si liquid phase alloy;

forming the SiNWs from the respective teardrop-shaped drops of the Ni—Si liquid phase alloy on the surface of the UMG Si plate, such that each SiNW has a length of at least 10 nanometers (nm);

providing another doping gas to obtain a thin film on an outside surface of each of the SiNWs to obtain a positive-negative (P-N) junction; and sequentially, obtaining a transparent conductive electrode through a sputtering deposition process and then processing a screen printing to obtain a front contact of silver paste and a back contact of aluminum paste.

2. The method according to claim 1, wherein said UMG Si plate is selected from a group consisting of a positive type (p-type) UMG Si plate and a negative-type (n-type) UMG Si plate.

3. The method according to claim 1, wherein said Ni metal thin film has a thickness between 30 and 100 nanometers (nm).

4. The method according to claim 1, wherein said Ni metal thin film is a catalyst to grow a SiNW.

5. The method according to claim 1, wherein, in obtaining disilane ($Si_2H_6$) for a SiNW process with hydrogen ($H_2$) as a carrier gas and providing a doping gas to obtain the SiNWs on the surface of the UMG Si plate that has the at least some teardrop-shaped drops of said Ni—Si liquid phase alloy, each said SiNW is obtained at a temperature between 650 and 700 Celsius degrees (° C.).

6. The method according to claim 1, wherein, in obtaining disilane ($Si_2H_6$) for a SiNW process with hydrogen ($H_2$) as a carrier gas and providing a doping gas to obtain the SiNWs on the surface of the UMG Si plate that has the at least some teardrop-shaped drops of said Ni—Si liquid phase alloy, said doping gas is selected from a group consisting of diborane ($B_2H_6$).

7. The method according to claim 1, wherein, in obtaining disilane ($Si_2H_6$) for a SiNW process with hydrogen ($H_2$) as a carrier gas and providing a doping gas to obtain the SiNWs on the surface of the UMG Si plate that has the at least some teardrop-shaped drops of said Ni—Si liquid phase alloy, each said SiNW is obtained within a time period between 1 and 10 minutes (min).

8. The method according to claim 1, wherein a SiNW is being formed as a solar light absorption layer, said solar light absorption layer selected from a group consisting of a positive type (p-type) absorption layer and a negative-type (n-type) absorption layer.

9. The method according to claim 1, wherein, in providing another doping gas to obtain a thin film on an outside surface of each of the SiNWs, said doping gas is selected from a group consisting of phosphine ($PH_3$).

10. The method according to claim 1, wherein said positive-negative (P-N) junction is formed by diffusion at a temperature of about 800 Celsius degrees (° C.)±10° C.

\* \* \* \* \*